(12) United States Patent
Chang (10) Patent No.: US 9,340,003 B2
(45) Date of Patent: May 17, 2016

(54) MANUFACTURING METHOD OF CIRCUIT BOARD

(71) Applicant: Unimicron Technology Corp., Taoyuan (TW)

(72) Inventor: Chen-Chuan Chang, Taoyuan County (TW)

(73) Assignee: Unimicron Technology Corp., Taoyuan (TW)

( * ) Notice: Subject to any disclaimer, the term of this patent is extended or adjusted under 35 U.S.C. 154(b) by 333 days.

(21) Appl. No.: 13/919,711

(22) Filed: Jun. 17, 2013

(65) Prior Publication Data

US 2013/0276969 A1    Oct. 24, 2013

Related U.S. Application Data

(62) Division of application No. 12/782,900, filed on May 19, 2010, now Pat. No. 8,519,270.

(51) Int. Cl.
*B32B 38/10* (2006.01)
*H05K 3/46* (2006.01)

(52) U.S. Cl.
CPC ............... *B32B 38/10* (2013.01); *H05K 3/4697* (2013.01); *H05K 3/4623* (2013.01); *H05K 3/4652* (2013.01); *H05K 2201/0355* (2013.01); *H05K 2201/09127* (2013.01); *H05K 2203/107* (2013.01); *Y10T 156/1052* (2015.01)

(58) Field of Classification Search
CPC ..... H05K 3/46; H05K 3/4602; H05K 3/4611; H05K 3/462; H05K 3/4623; H05K 3/4652; H05K 3/4697; H05K 2201/0355; H05K 2201/09127; H05K 2203/107; B32B 38/10; Y10T 156/1052

See application file for complete search history.

(56) References Cited

U.S. PATENT DOCUMENTS

| | | | | |
|---|---|---|---|---|
| 5,558,928 | A * | 9/1996 | DiStefano et al. | 428/209 |
| 6,316,732 | B1 * | 11/2001 | Lim | 174/255 |
| 6,333,856 | B1 * | 12/2001 | Harju | 361/761 |
| 2007/0176613 | A1 * | 8/2007 | Ogawa et al. | 324/754 |

(Continued)

FOREIGN PATENT DOCUMENTS

| | | |
|---|---|---|
| JP | H01-093198 | 4/1989 |
| JP | H10-22645 | 1/1998 |

(Continued)

OTHER PUBLICATIONS

"Office Action of Japan counterpart application" issued on Oct. 1, 2013, p. 1-p. 3.

*Primary Examiner* — Carl Arbes
(74) *Attorney, Agent, or Firm* — J.C. Patents (57) ABSTRACT

A manufacturing method of a circuit board comprises the following steps. Firstly, provide a first core layer, a second core material layer, and a central dielectric material layer. Secondly, press the first core layer, the second core material layer, and the central dielectric material layer to form a composite circuit structure. Thirdly, removing a portion of the central dielectric material layer located at a periphery of a pre-removing area and a portion of the second core material layer located at the periphery of the pre-removing area. Finally, remove a portion of the central dielectric material layer located within the pre-removing area and a portion of the second core material layer located within the pre-removing area to form a central dielectric layer and a second core layer.

7 Claims, 10 Drawing Sheets

(56) References Cited

U.S. PATENT DOCUMENTS

2010/0009178 A1* 1/2010 Weidinger et al. ............ 428/336
2010/0059262 A1* 3/2010 Weidinger et al. ............ 174/258
2011/0272177 A1* 11/2011 Weichslberger et al. ..... 174/250

FOREIGN PATENT DOCUMENTS

| JP | 2009-158770 | | 7/2009 |
| JP | 2009-200389 | | 9/2009 |
| WO | 2008/098269 A1 | * | 8/2008 |

* cited by examiner

MANUFACTURING METHOD OF CIRCUIT BOARD

CROSS-REFERENCE TO RELATED APPLICATION

This application is a divisional application of and claims the priority benefit of U.S. application Ser. No. 12/782,900, filed on May 19, 2010, now allowed. The entirety of the above-mentioned patent application is hereby incorporated by reference herein and made a part of this specification.

BACKGROUND OF THE INVENTION

1. Field of the Invention

The present invention generally relates to a manufacturing method of a circuit board, and more particularly, to a manufacturing method of a circuit board having a cavity.

2. Description of Related Art

Today's market demands electronic products to be designed small, slim, light, and highly portable. Accordingly, the assembled thickness of electronic devices and a circuit board in such an electronic product has to be reduced too.

Figure 1:
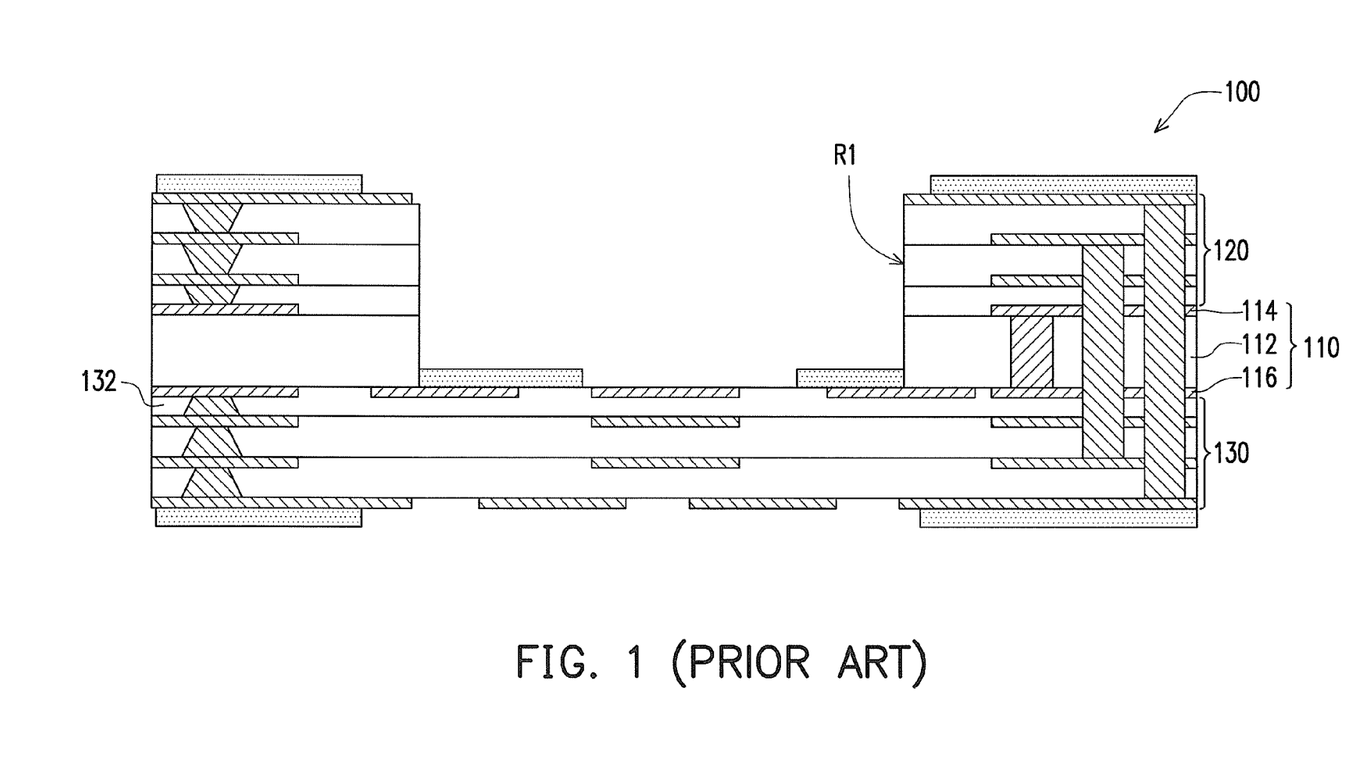
FIG. 1 is a cross-sectional view of a conventional circuit board.

Conventionally, the assembled thickness of an electronic device (such as a chip packaging structure) and a circuit board is reduced by forming a cavity on the circuit board and disposing the electronic device in the cavity. FIG. 1 is a cross-sectional view of a conventional circuit board. Referring to FIG. 1, the circuit board 100 has a core layer 110 and circuit structures 120 and 130 respectively disposed on and below the core layer 110. The core layer 110 has a core dielectric layer 112 and two circuit layers 114 and 116 respectively disposed on and below the core dielectric layer 112. A cavity R1 runs through the circuit structure 120 and the core dielectric layer 112 and exposes the circuit layer 116.

In a conventional manufacturing process of the circuit board 100, additional layers are added to both sides of the core layer 110 to form the circuit structure 120 and the circuit structure 130, and a portion of the circuit structure 120 and a portion of the core dielectric layer 112 are removed to expose the circuit layer 116. Thus, the circuit layer 116 is embedded in a dielectric layer 132 of the circuit structure 130.

SUMMARY OF THE INVENTION

Accordingly, the present invention is directed to a circuit board having two stacked core layers.

The present invention is further directed to a manufacturing method of a circuit board, wherein the circuit board has two stacked core layers.

The present invention provides a circuit board having a cavity. The circuit board includes a first core layer, a second core layer, and a central dielectric layer. The first core layer includes a core dielectric layer and a core circuit layer, wherein the core circuit layer is disposed on the core dielectric layer. The second core layer is disposed on the first core layer. The central dielectric layer is disposed between the first core layer and the second core layer. The cavity runs through the second core layer and the central dielectric layer and exposes a portion of the core circuit layer.

According to an embodiment of the present invention, the core circuit layer protrudes from the surface of the core dielectric layer.

According to an embodiment of the present invention, the circuit board further includes a first circuit structure and a second circuit structure. The first circuit structure is disposed at one side of the first core layer away from the central dielectric layer, the second circuit structure is disposed at one side of the second core layer away from the central dielectric layer, and the cavity runs through the second circuit structure.

According to an embodiment of the present invention, the first circuit structure includes a first dielectric layer and a first circuit layer, the first dielectric layer is disposed on the first core layer, and the first circuit layer is disposed on the first dielectric layer.

According to an embodiment of the present invention, the second circuit structure includes a second dielectric layer and a second circuit layer, the second dielectric layer is disposed on the second core layer, and the second circuit layer is disposed on the second dielectric layer.

According to an embodiment of the present invention, the core circuit layer has a laser resistant pattern, and the laser resistant pattern is located at the periphery of a portion of the core dielectric layer exposed by the cavity.

According to an embodiment of the present invention, the central dielectric layer covers a portion of the laser resistant pattern, and the cavity exposes another portion of the laser resistant pattern.

According to an embodiment of the present invention, a gap exists between the central dielectric layer and the core dielectric layer and the gap is located at a periphery of a portion of the core dielectric layer exposed by the cavity.

The present invention provides a manufacturing method of a circuit board. First, a first core layer, a second core material layer, and a central dielectric material layer are provided. The first core layer includes a core dielectric layer and a core circuit layer. The core circuit layer is disposed on the core dielectric layer, and the core circuit layer is a non-embedded circuit layer. The second core material layer is disposed on the first core layer, and the central dielectric material layer is disposed between the first core layer and the second core material layer. Then, the first core layer, the second core material layer, and the central dielectric material layer are pressed to form a composite circuit structure, wherein the composite circuit structure has a pre-removing area, and at least a portion of the core circuit layer is located within the pre-removing area. Next, the portion of the central dielectric material layer located at the periphery of the pre-removing area and the portion of the second core material layer located at the periphery of the pre-removing area are removed. Thereafter, the portion of the central dielectric material layer located within the pre-removing area and the portion of the second core material layer located within the pre-removing area are removed to form a central dielectric layer and a second core layer.

According to an embodiment of the present invention, the step of pressing the first core layer, the second core material layer, and the central dielectric material layer further includes following processes. First, a first dielectric material layer and a first conductive layer are pressed onto the first core layer, wherein the first dielectric material layer is located between the first core layer and the first conductive layer. A second dielectric material layer and a second conductive layer are pressed onto the second core layer, wherein the second dielectric material layer is located between the second core layer and the second conductive layer. Next, the first conductive layer and the second conductive layer are patterned to form a first circuit layer and a second circuit layer.

According to an embodiment of the present invention, the manufacturing method further includes removing the portion of the second dielectric material layer located at the periphery of the pre-removing area while removing the portions of the central dielectric material layer and the second core material layer located at the periphery of the pre-removing area and removing the portion of the second dielectric material layer located within the pre-removing area while removing the portions of the central dielectric material layer and the second core material layer located within the pre-removing area to form a second dielectric layer.

According to an embodiment of the present invention, the technique of removing the portion of the central dielectric material layer located at the periphery of the pre-removing area and the portion of the second core material layer located at the periphery of the pre-removing area includes a laser etching technique.

According to an embodiment of the present invention, the core circuit layer has a laser resistant pattern, and the laser resistant pattern is located at the periphery of the pre-removing area.

According to an embodiment of the present invention, the manufacturing method further comprises performing an etching process or a mechanical processing to remove the laser resistant pattern.

According to an embodiment of the present invention, the technique of removing the portion of the central dielectric material layer located within the pre-removing area and the portion of the second core material layer located within the pre-removing area includes a lift-off technique.

According to an embodiment of the present invention, the first core layer further includes a protection layer, and the protection layer covers the portion of the core circuit layer located within the pre-removing area.

According to an embodiment of the present invention, the manufacturing method further includes removing the protection layer after removing the portion of the central dielectric material layer located within the pre-removing area and the portion of the second core material layer located within the pre-removing area.

The present invention provides a circuit board having a cavity. The circuit board includes a multilayer core structure. The multilayer core structure includes a plurality of core layers and a plurality of central dielectric layers that are alternatively stacked together. The cavity runs through a portion of the core layers and at least a portion of the central dielectric layers of the multilayer core structure. One of the core layers is located at the bottom of the cavity, and the cavity exposes a core circuit layer of the core layer located at the bottom of the cavity.

According to an embodiment of the present invention, the circuit board further includes a first circuit structure and a second circuit structure. The first circuit structure is disposed at a first side of the multilayer core structure. The second circuit structure is disposed at a second side of the multilayer core structure, wherein the first side is opposite to the second side, and the cavity runs through the second circuit structure.

According to an embodiment of the present invention, the first circuit structure includes a first dielectric layer and a first circuit layer. The first dielectric layer is disposed on the first side of the multilayer core structure. The first circuit layer is disposed on the first dielectric layer.

According to an embodiment of the present invention, the second circuit structure includes a second dielectric layer and a second circuit layer. The second dielectric layer is disposed on the second side of the multilayer core structure. The second circuit layer is disposed on the second dielectric layer.

As described above, a circuit board provided by the present invention has a plurality of core layers and a plurality of central dielectric layers that are alternatively stacked together. Thus, when a cavity runs through more than half of the dielectric layers, the cavity runs through some of the core layers and at least some of the central dielectric layers and exposes a core circuit layer of the core layer located at the bottom of the cavity.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3E' is a variation of the circuit board in FIG. 3E.

FIG. 3E" is a variation of the circuit board in FIG. 3E.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 2A:
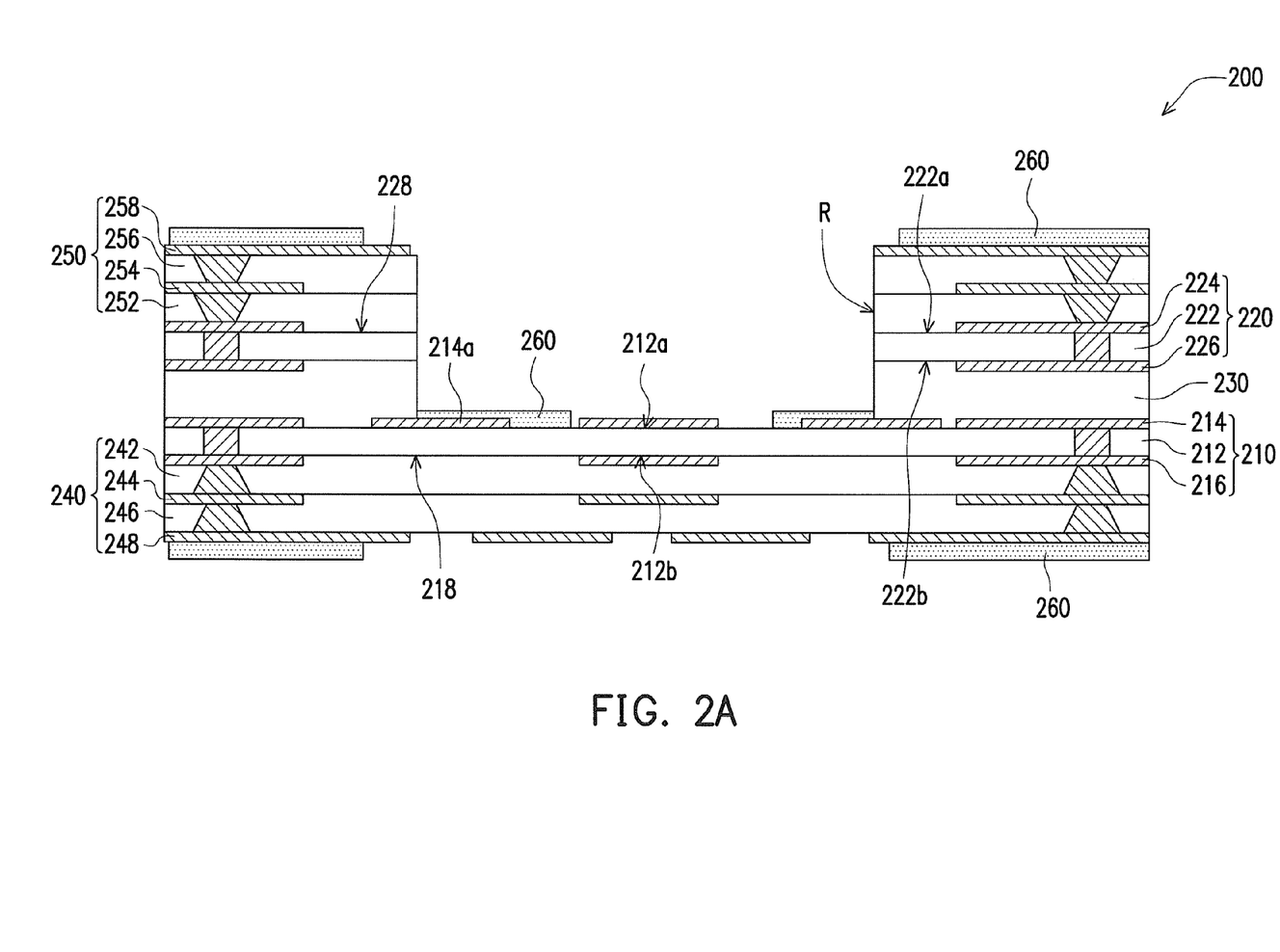
FIG. 2A is a cross-sectional view of a circuit board according to an embodiment of the present invention.
Figure 2B:
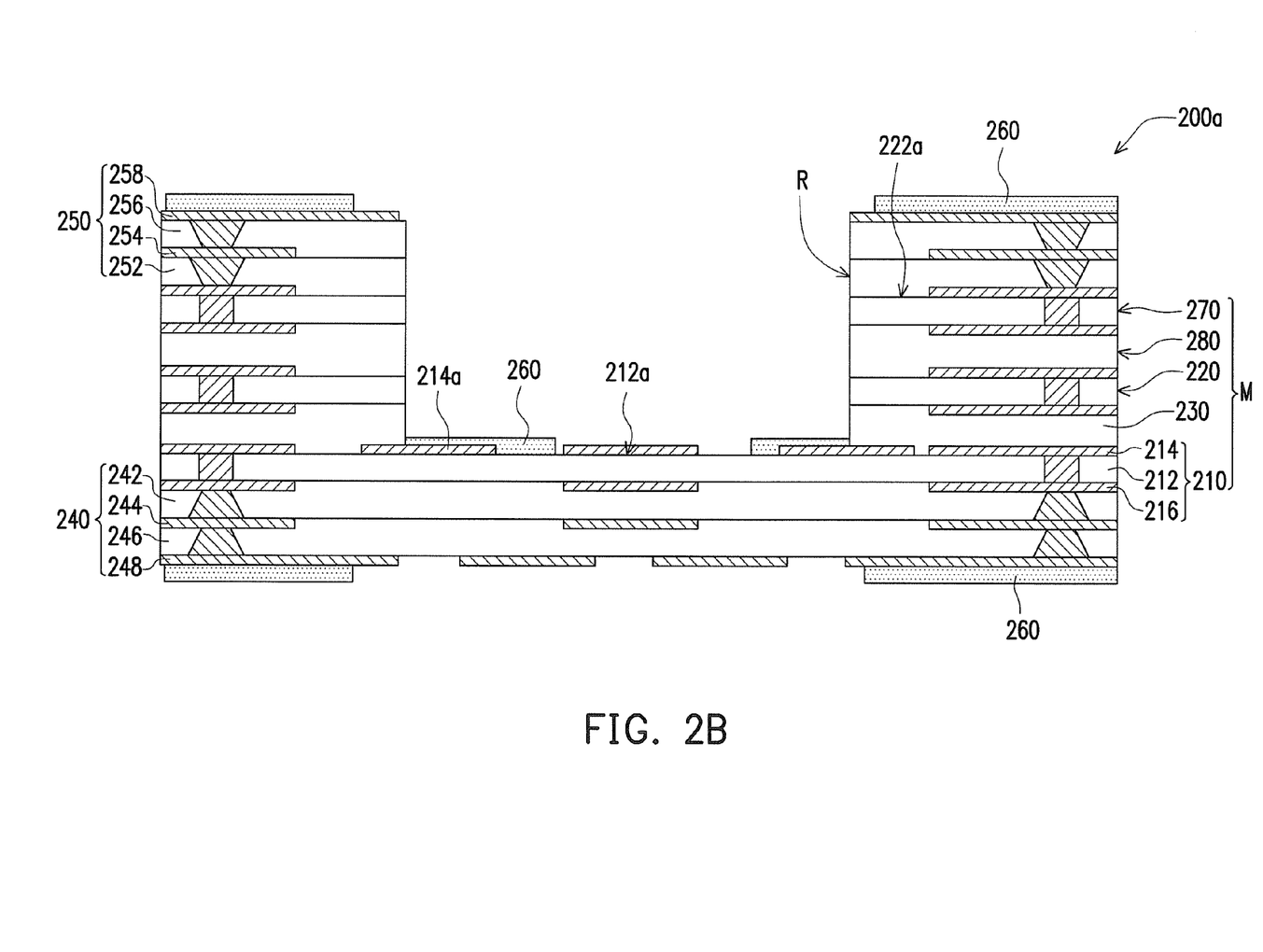
FIG. 2B illustrates a variation of the circuit board in FIG. 2A.

FIG. 2A is a cross-sectional view of a circuit board according to an embodiment of the present invention, and FIG. 2B illustrates a variation of the circuit board in FIG. 2A. Referring to FIG. 2A, the circuit board 200 in the present embodiment has a cavity R. The circuit board 200 includes a first core layer 210, a second core layer 220, a central dielectric layer 230, a first circuit structure 240, and a second circuit structure 250.

The first core layer 210 includes a core dielectric layer 212 and two core circuit layers 214 and 216. The core circuit layers 214 and 216 are respectively disposed on the upper surface 212a and the lower surface 212b of the core dielectric layer 212 and are electrically connected with each other. The core circuit layers 214 and 216 respectively protrude from the surfaces 212a and 212b of the core dielectric layer 212.

The second core layer 220 is disposed on the first core layer 210. The second core layer 220 includes a core dielectric layer 222 and two core circuit layers 224 and 226. The core circuit layers 224 and 226 are respectively disposed on the upper surface 222a and the lower surface 222b of the core dielectric layer 222 and are electrically connected with each other. The central dielectric layer 230 is disposed between the first core layer 210 and the second core layer 220.

The first circuit structure 240 is disposed on the side 218 of the first core layer 210 that is away from the central dielectric layer 230. In the present embodiment, the first circuit structure 240 includes two dielectric layers 242 and 246 and two circuit layers 244 and 248 that are stacked together. The dielectric layer 242 is disposed on the first core layer 210, the circuit layer 244 is disposed on the dielectric layer 242 and between the dielectric layers 242 and 246, and the circuit layer 248 is disposed at one side of the dielectric layer 246 that is away from the circuit layer 244. However, the numbers of the circuit layers and the dielectric layers of the first circuit structure 240 are not limited in the present embodiment. In other words, there may be one or multiple circuit layers or dielectric layers.

The second circuit structure 250 is disposed at the side 228 of the second core layer 220 that is away from the central dielectric layer 230. In the present embodiment, the second circuit structure 250 includes two dielectric layers 252 and 256 and two circuit layers 254 and 258 that are stacked together. The dielectric layer 252 is disposed on the second core layer 220, the circuit layer 254 is disposed on the dielectric layer 252 and between the dielectric layers 252 and 256, and the circuit layer 258 is disposed at one side of the dielectric layer 256 that is away from the circuit layer 254. However, the numbers of the circuit layers and the dielectric layers of the second circuit structure 250 are not limited in the present embodiment. In other words, there may be one or multiple circuit layers or dielectric layers.

The cavity R of the circuit board 200 runs through the second core layer 220, the central dielectric layer 230, and the second circuit structure 250 and exposes a portion of the core circuit layer 214. It should be noted that in the present embodiment, the total number of dielectric layers ran through by the cavity R (including the central dielectric layer 230, the core dielectric layer 222, and the dielectric layers 252 and 256) is greater than the total number of dielectric layers not ran through by the cavity R (including the core dielectric layer 212 and the dielectric layers 242 and 246). In other words, the cavity R runs through more than half of the dielectric layers (of the circuit board 200). However, in other embodiments, the cavity R may also run through less than half of the dielectric layers. In the present embodiment, because the circuit board 200 has the first core layer 210 and the second core layer 220 that are stacked together, the cavity R runs through the second core layer 220 and exposes the core circuit layer 214 of the first core layer 210 when the cavity R runs through more than half of the dielectric layers.

It should be noted that the number of core layers is not limited in the present embodiment. In other words, there may be three or more core layers. The cavity may run through a portion of the core layers and at least a portion of the central dielectric layers, one of the core layers may be located at the bottom of the cavity, and the cavity may expose a core circuit layer of the core layer located at the bottom of the cavity. For example, as shown in FIG. 2B, the circuit board 200a in the present embodiment includes a multilayer core structure M. The multilayer core structure M has a first core layer 210, a second core layer 220, a third core layer 270, a central dielectric layer 230 disposed between the first core layer 210 and the second core layer 220, and a central dielectric layer 280 disposed between the second core layer 220 and the third core layer 270. The cavity R runs through the second core layer 220, the third core layer 270, the central dielectric layer 230, and the central dielectric layer 280 and exposes a core circuit layer 214 of the first core layer 210 located at the bottom of the cavity R. It should be noted that the numbers of core layers in the multilayer core structure M that are ran through and not ran through by the cavity R are not limited in the present embodiment. In other words, the cavity R may only run through the third core layer 270.

Referring to FIG. 2A again, in the present embodiment, the core circuit layer 214 has a laser resistant pattern 214a located at the periphery of the core dielectric layer 212 exposed by the cavity R. The central dielectric layer 230 covers a portion of the laser resistant pattern 214a, and the cavity R exposes another portion of the laser resistant pattern 214a. Additionally, in the present embodiment, a solder mask layer 260 may be respectively formed on the first circuit structure 240, the second circuit structure 250, and the first core layer 210 to cover and protect portions of the circuit layer 248, the circuit layer 258, and the core circuit layer 214.

Below, a manufacturing method of the circuit board 200 in the present embodiment will be described in detail.

Figure 3A:
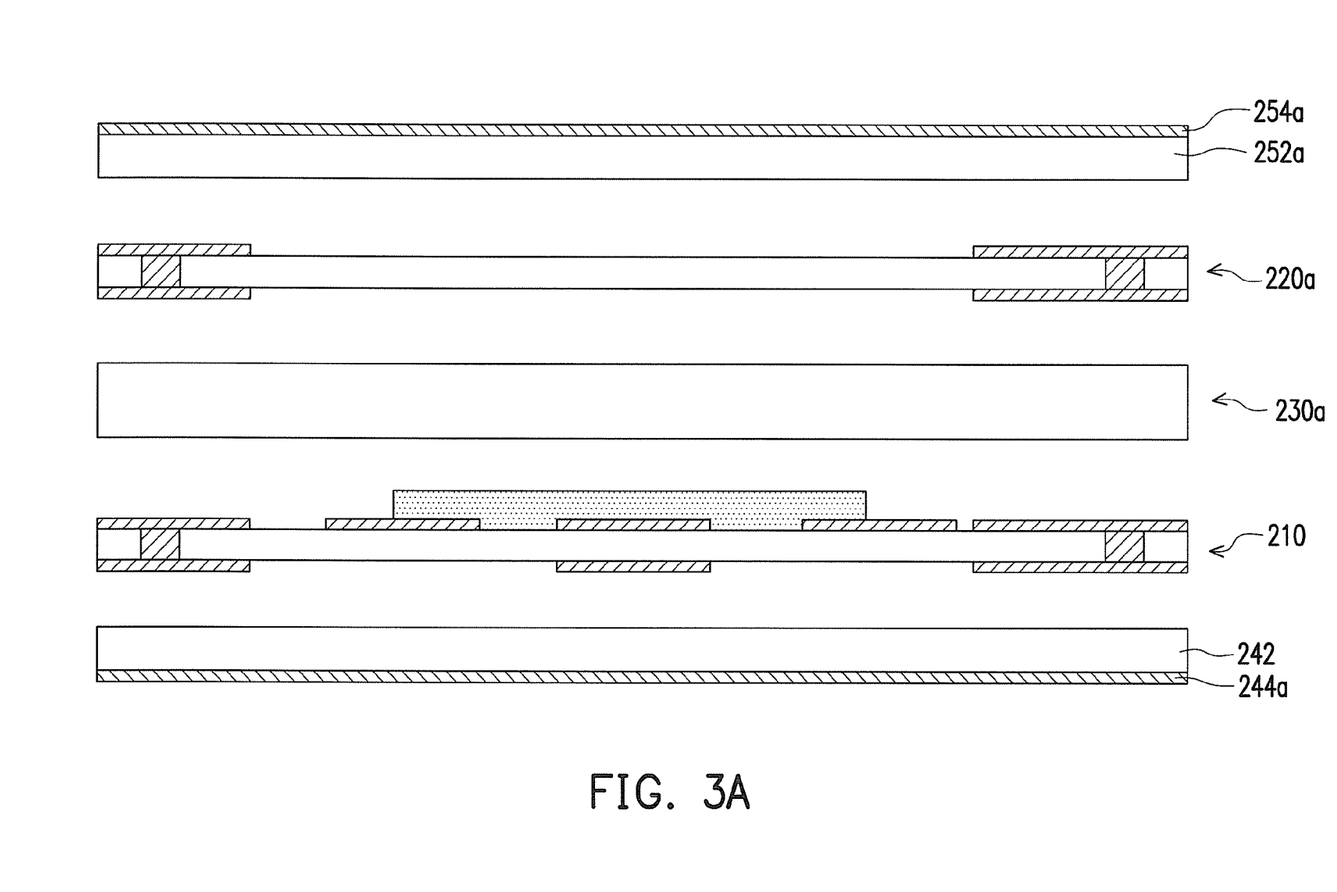
FIGS. 3A-3E are cross-sectional views illustrating a manufacturing process of a circuit board according to an embodiment of the present invention.
Figure 3B:
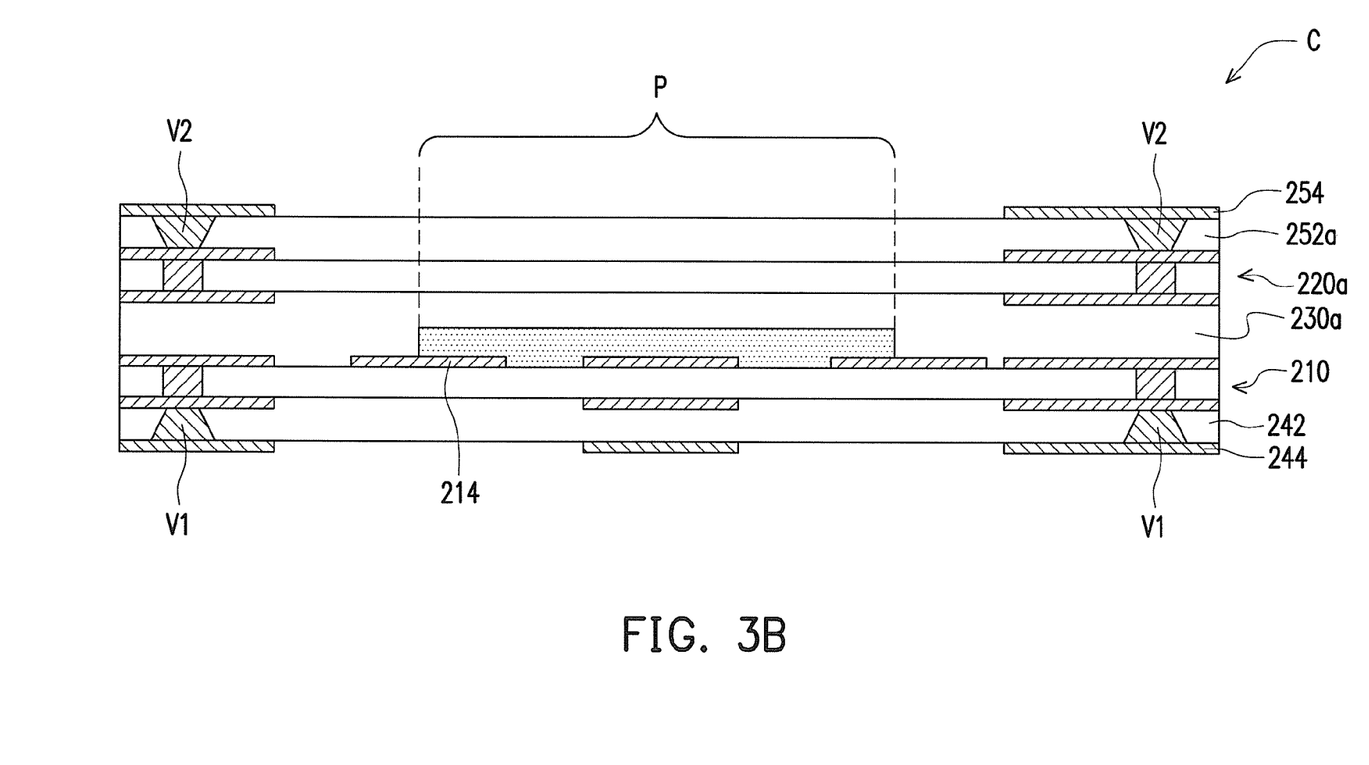
Figure 3C:
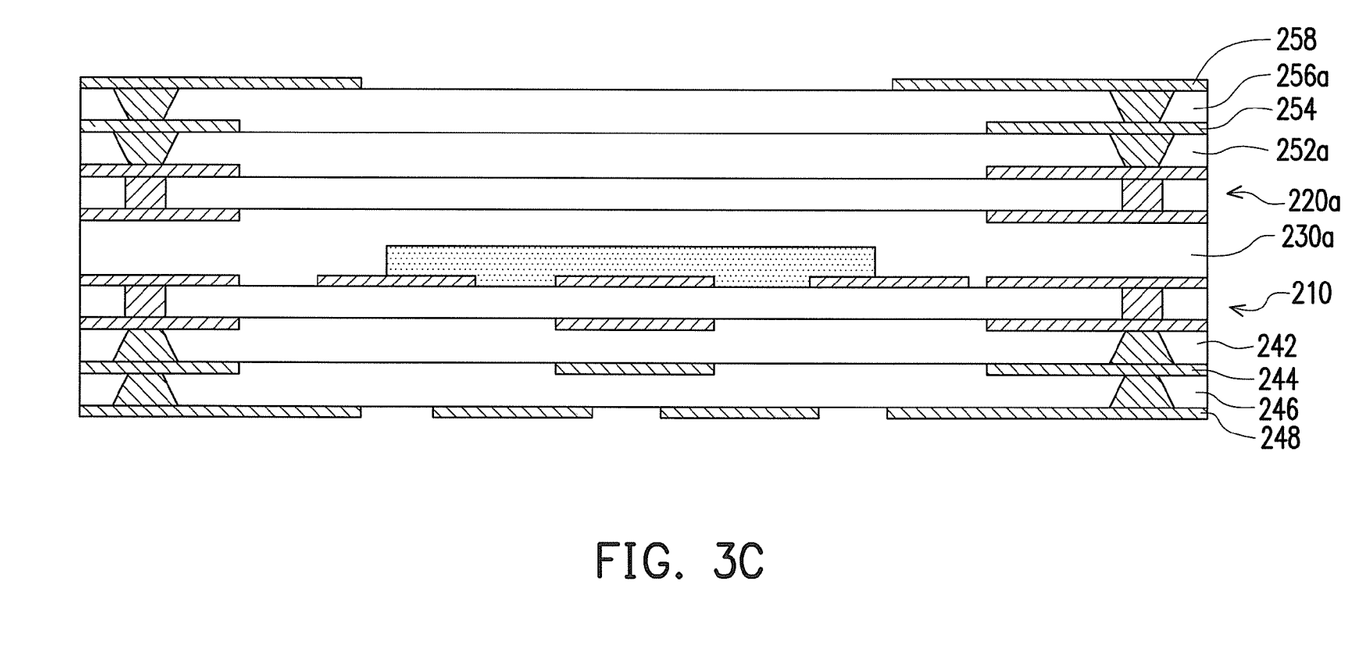
Figure 3D:
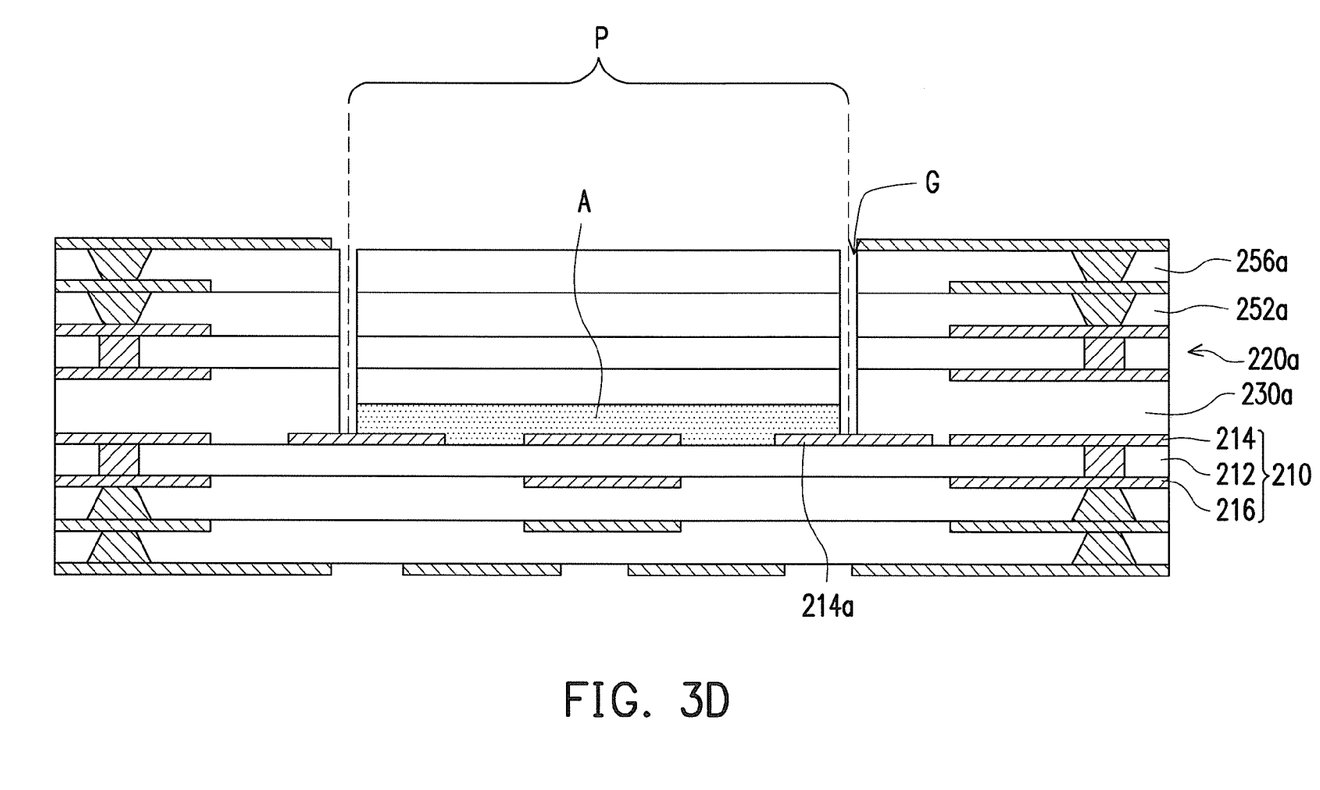
Figure 3E:
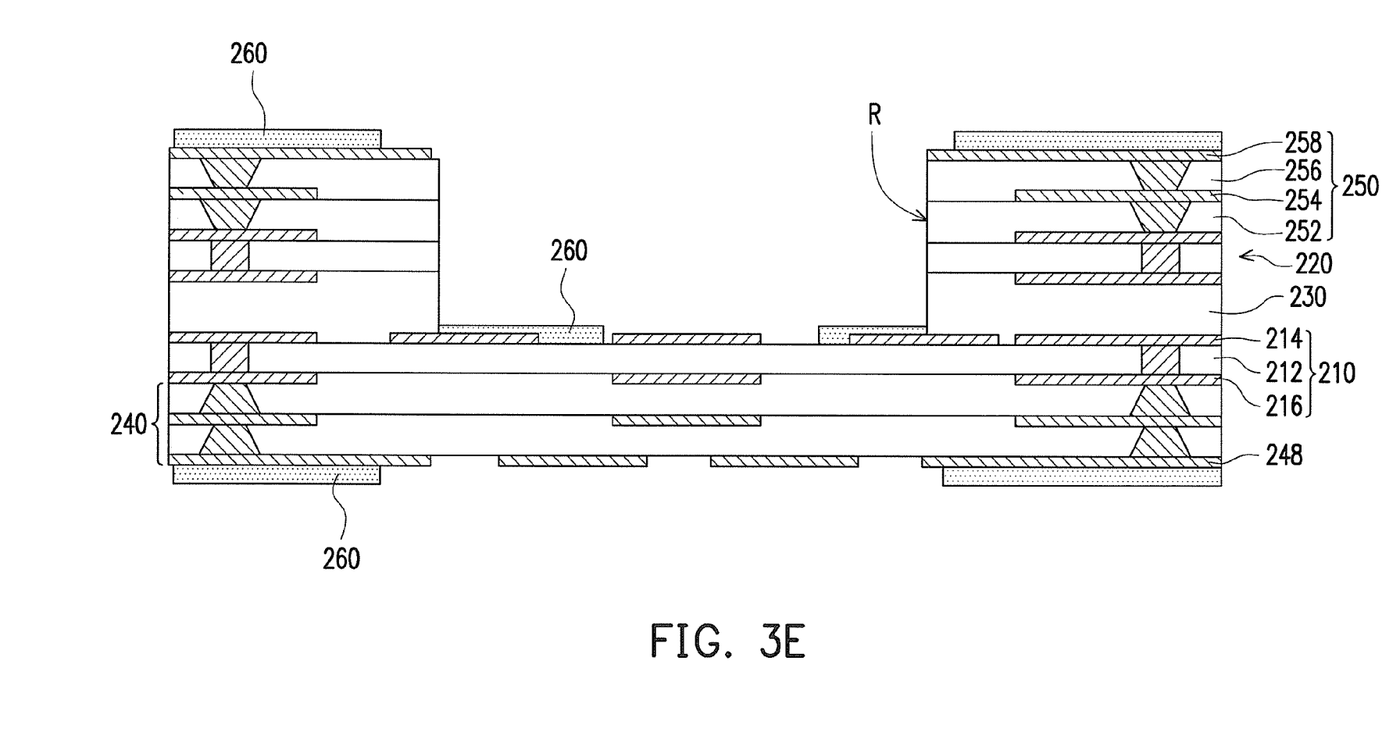

FIGS. 3A-3E are cross-sectional views illustrating a manufacturing process of a circuit board according to an embodiment of the present invention. FIG. 3E' is a variation of the circuit board in FIG. 3E. FIG. 3E'' is a variation of the circuit board in FIG. 3E.

First, referring to FIG. 3A, a first core layer 210, a second core material layer 220a, a central dielectric material layer 230a, a dielectric layer 242, a conductive layer 244a, a dielectric material layer 252a, and a conductive layer 254a are provided.

The first core layer 210 has the same structure as the first core layer 210 in FIG. 2A. The second core material layer 220a is disposed on the first core layer 210. The central dielectric material layer 230a is disposed between the first core layer 210 and the second core material layer 220a. The dielectric layer 242 is disposed at one side of the first core layer 210 away from the central dielectric material layer 230a and is located between the first core layer 210 and the conductive layer 244a. The dielectric material layer 252a is disposed at one side of the second core material layer 220a away from the central dielectric material layer 230a and is located between the conductive layer 254a and the second core material layer 220a.

Then, referring to FIG. 3B, the first core layer 210, the second core material layer 220a, the central dielectric material layer 230a, the dielectric layer 242, the conductive layer 244a, the dielectric material layer 252a, and the conductive layer 254a are pressed together to form a composite circuit structure C. The composite circuit structure C has a pre-removing area P, and a portion of the core circuit layer 214 is located within the pre-removing area P. Next, the conductive layer 244a and the conductive layer 254a are respectively patterned to form a circuit layer 244 and a circuit layer 254, and a plurality of conductive channels V1 and V2 are formed such that the circuit layer 244 and the circuit layer 254 are respectively electrically connected to the first core layer 210 and the second core material layer 220a.

Thereafter, referring to FIG. 3C, a dielectric layer 246 and a circuit layer 248 are selectively formed on the dielectric layer 242 through the same technique for forming the dielectric layer 242, the circuit layer 244, the dielectric material layer 252a, and the circuit layer 254, and a dielectric material layer 256a and a circuit layer 258 are formed on the dielectric material layer 252a.

Next, referring to FIG. 3D, the central dielectric material layer 230a, the second core material layer 220a, and the dielectric material layers 252a and 256a located at the periphery of the pre-removing area P are removed through a laser etching process, so as to form a gap G running through foregoing material layers 230a, 220a, 252a, and 256a. In the present embodiment, the core circuit layer 214 may have a laser resistant pattern 214a located at the periphery of the pre-removing area P for protecting the core dielectric layer 212 from being damaged by the laser etching process. Additionally, the first core layer 210 may have a protection layer A. The protection layer A covers the portion of the core circuit layer 214 located within the pre-removing area P so as to protect the core circuit layer 214 in subsequent removing processes. Moreover, the protection layer A may be a release layer such that the central dielectric material layer 230a located within the pre-removing area P can be removed easily.

After that, referring to FIG. 3E, the central dielectric material layer 230a, the second core material layer 220a, and the dielectric material layers 252a and 256a located within the pre-removing area P are removed through a lift-off technique, so as to form a central dielectric layer 230, a second core layer 220, dielectric layers 252 and 256, and a cavity R. The dielectric layers 252 and 256 and the circuit layers 254 and 258 form a second circuit structure 250, and the cavity R runs through the second circuit structure 250, the second core layer 220, and the central dielectric layer 230. Next, the protection layer A is removed. In other embodiments, the protection layer A and the central dielectric material layer 230a, the second core material layer 220a, and the dielectric material layers 252a and 256a located within the pre-removing area P may be removed all together. After that, in the present embodiment, a solder mask layer 260 is respectively formed on the first circuit structure 240, the second circuit structure 250, and the first core layer 210 to cover and protect portions of the circuit layers 248 and 258 and the core circuit layer 214.

In other embodiments, referring to FIG. 3E', before forming the solder mask layer 260, a portion of the laser resistant pattern 214a exposed by the cavity R is removed by a mechanical processing.

In still another embodiments, referring to FIG. 3E", before forming the solder mask layer 260, the laser resistant pattern 214a is removed by an etching process.

Up to this point, a gap G exists between the central dielectric layer 230 and the core dielectric layer 212 and the gap G is located at a periphery of a portion of the core dielectric layer 212 exposed by the cavity R.

In summary, a circuit board provided by the present invention has a plurality of core layers and a plurality of central dielectric layer that are alternatively stacked together. Thus, when a cavity runs through more than half of the dielectric layers, the cavity runs through a portion of the core layers and at least a portion of the central dielectric layers and exposes a core circuit layer of the core layer located at the bottom of the cavity.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of a circuit board, comprising:
    providing a first core layer, a second core material layer, and a central dielectric material layer, wherein the first core layer comprises a core dielectric layer and a core circuit layer, the core circuit layer is disposed on the core dielectric layer and has a laser resistant pattern, the laser resistant pattern is located at a boundary of the pre-removing area, the laser resistant pattern is a portion of the core circuit layer and is physically independent from the rest of the core circuit layer, the second core material layer is disposed on the first core layer, and the central dielectric material layer is disposed between the first core layer and the second core material layer;
    pressing the first core layer, the second core material layer, and the central dielectric material layer to form a composite circuit structure, wherein a pre-removing area is defined on the composite circuit structure, and at least a portion of the core circuit layer is located within the pre-removing area;
    removing a portion of the central dielectric material layer located at the boundary of the pre-removing area and a portion of the second core material layer located at the boundary of the pre-removing area by laser etching; and
    removing a portion of the central dielectric material layer located within the pre-removing area and a portion of the second core material layer located within the pre-removing area to form a central dielectric layer and a second core layer.

2. The manufacturing method according to claim 1, wherein the step of pressing the first core layer, the second core material layer, and the central dielectric material layer further comprises:
    pressing a first dielectric material layer and a first conductive layer onto the first core layer, wherein the first dielectric material layer is located between the first core layer and the first conductive layer;
    pressing a second dielectric material layer and a second conductive layer onto the second core layer, wherein the second dielectric material layer is located between the second core layer and the second conductive layer; and
    patterning the first conductive layer and the second conductive layer to form a first circuit layer and a second circuit layer.

3. The manufacturing method according to claim 2 further comprising:
    when removing the portion of the central dielectric material layer located at the boundary of the pre-removing area and the portion of the second core material layer located at the boundary of the pre-removing area, removing a portion of the second dielectric material layer located at the boundary of the pre-removing area; and
    when removing the portion of the central dielectric material layer located within the pre-removing area and the portion of the second core material layer located within the pre-removing area, removing a portion of the second dielectric material layer located within the pre-removing area to form a second dielectric layer.

4. The manufacturing method according to claim 1 further comprising performing an etching process or a mechanical processing to remove the laser resistant pattern.

5. The manufacturing method according to claim 1, wherein the technique of removing the portion of the central dielectric material layer located within the pre-removing area and the portion of the second core material layer located within the pre-removing area comprises a lift-off technique.

6. The manufacturing method according to claim 1, wherein the first core layer further comprises:
    a protection layer, covering the portion of the core circuit layer located within the pre-removing area.

7. The manufacturing method according to claim 6 further comprising:
    when or after removing the portion of the central dielectric material layer located within the pre-removing area and the portion of the second core material layer located within the pre-removing area, removing the protection layer.

* * * * *